(12) United States Patent
Liu et al.

(10) Patent No.: US 8,135,105 B2
(45) Date of Patent: Mar. 13, 2012

(54) CIRCUIT FOR CORRECTING AN OUTPUT CLOCK FREQUENCY IN A RECEIVING DEVICE

(75) Inventors: Zhibing Liu, Fremont, CA (US); Sheng-Chiech Liang, Los Altos, CA (US)

(73) Assignee: Integraded Device Technologies, Inc., San Jose, CA (US)

( * ) Notice: Subject to any disclaimer, the term of this patent is extended or adjusted under 35 U.S.C. 154(b) by 889 days.

(21) Appl. No.: 12/214,288

(22) Filed: Jun. 17, 2008

(65) Prior Publication Data

US 2009/0310729 A1 Dec. 17, 2009

(51) Int. Cl.
H04L 7/00 (2006.01)

(52) U.S. Cl. ........ 375/376; 375/316; 375/373; 375/371; 375/374; 375/375; 375/362; 375/354

(58) Field of Classification Search ............... 375/376, 375/316, 373, 371, 374, 375, 362, 354
See application file for complete search history.

(56) References Cited

U.S. PATENT DOCUMENTS

| | | | |
|---|---|---|---|
| 5,526,362 A * | 6/1996 | Thompson et al. | 370/516 |
| 5,812,618 A | 9/1998 | Muntz et al. | |
| 5,936,675 A | 8/1999 | Zhang et al. | |
| 7,193,928 B2 * | 3/2007 | Kanzaki et al. | 365/210.1 |
| 7,295,578 B1 * | 11/2007 | Lyle et al. | 370/503 |
| 2002/0181459 A1 * | 12/2002 | Ohta et al. | 370/389 |
| 2003/0112758 A1 | 6/2003 | Pang et al. | |
| 2006/0268912 A1 * | 11/2006 | Read | 370/412 |

OTHER PUBLICATIONS

Notification of Transmittal of International Preliminary Report on Patentability with Written Opinion for PCT/US2009/047456 (related to the present application), publication date Dec. 29, 2010, Integrated Device Technology, Inc.
Notification of Transmittal of International Search Report and Written Opinion of the International Searching Authority with Search Report and Written Opinion for PCT/US2009/047456 (related to the present application), publication date Sep. 23, 2003, Integrated Device Technology, Inc.

* cited by examiner

Primary Examiner — Siu Lee
(74) Attorney, Agent, or Firm — Roeder and Broder (57) ABSTRACT

An output clock correction circuit (14) for correcting a frequency of an output clock in a receiving device (13) that receives data (16) and a time stamp component (18) includes an output clock feedback loop (20), a FIFO buffer (22) and a time stamp adjuster (24). The output clock feedback loop (20) adjusts a phase and/or a frequency of the output clock based at least partially on the time stamp component (18). The FIFO buffer (22) temporarily stores the data (16). The time stamp adjuster (24) selectively adjusts the time stamp component (18) based on a status of the FIFO buffer (22). In one embodiment, the status is based at least in part on an actual data level in the FIFO buffer (22). In another embodiment, the FIFO buffer (22) has a target data level range, and the time stamp adjuster (24) adjusts the time stamp component (18) when the actual data level in the FIFO buffer (22) is outside this range. The time stamp adjuster (24) can adjust the time stamp component (18) by an amount that is based on a calculation, or an amount that is determined from a lookup table.

31 Claims, 6 Drawing Sheets

| FIFO Entries | Delta M Value |
|---|---|
| 8 | -240 |
| 16 | -160 |
| 24 | -80 |
| FIFO entries from 25 to 39 as normal variation range | |
| 40 | +80 |
| 48 | +160 |
| 56 | +240 |

CIRCUIT FOR CORRECTING AN OUTPUT CLOCK FREQUENCY IN A RECEIVING DEVICE

BACKGROUND

Serial data communications are used to communicate data between various devices. Receiving and correctly decoding a stream of serial data requires the system, including a transmitting device and a receiving device (such as a video display), to be synchronized. Often, a source clock signal, e.g., a Link Symbol Clock with a frequency of either 162 MHz ("reduced bit rate") or 270 MHz ("high bit rate"), and time stamp information or "counters" (also referred to herein as "M" and "N"), are included in a stream of serial data transmitted to the receiving device. In these types of systems, an output clock such as a stream clock (also sometimes referred to as a "pixel clock") having an output clock frequency that is different than the source clock frequency, e.g., within the range of between 25.175 MHz (such as VGA) and 268.5 MHz (such as WQXGA) at the receiving device must be accurately recovered to increase proper functioning of the system. In certain systems, the M and N time stamp information is embedded in a data stream from the transmitting device, and relates to the relative frequencies between the source clock and the output clock.

However, because of the frequency disparity between the source clock and the output clock, accurate output clock recovery, also sometimes referred to as stream clock recovery ("SCR"), can be difficult with conventional systems. In many systems, a line buffer (also sometimes referred to as a "first in, first out" or "FIFO" buffer) is used to temporarily store and regulate the flow of output clock data, such as pixel data, within the receiving device.

In some systems, the receiving device can perform output clock recovery techniques using a feedback loop, such as a phase-locked loop ("PLL"). The PLL analyzes the serial data stream and attempts to synchronize the receiving device with the transmitting device. However, it is well-known that PLL can result in random and/or deterministic jitter, which can cause transmission errors. This jitter can be continuously accumulated, which can ultimately impact the amount of pixel data in the FIFO buffer. For example, a gradual increase in pixel data in the FIFO buffer can lead to an excess of such data, which is referred to herein as an "overflow" condition. Conversely, a gradual decrease in pixel data in the FIFO buffer can result in a shortage of such data, which is referred to herein as an "underflow" condition. In either the overflow or the underflow condition, frame recovery and/or picture stability of the receiving device can be compromised.

SUMMARY

The present invention is directed toward a circuit for correcting a frequency of an output clock in a receiving device. The receiving device receives data and a time stamp component from a transmitting device. The time stamp component is based at least partially on a desired frequency of the output clock. In one embodiment, the circuit includes an output clock feedback loop, a FIFO buffer and a time stamp adjuster. The output clock feedback loop adjusts a phase of the output clock and/or a frequency of the output clock. This adjustment is based at least partially on the time stamp component. The FIFO buffer temporarily stores the data. The time stamp adjuster selectively adjusts the time stamp component based on a status of the FIFO buffer.

In certain embodiments, the output clock feedback loop is a phase-locked loop. In one embodiment, the FIFO buffer has an actual data level and the status of the FIFO buffer is based at least in part on the actual data level. In another embodiment, the FIFO buffer has a target data level range including an upper threshold and a lower threshold. In this embodiment, the time stamp adjuster adjusts the time stamp component when the actual data level in the FIFO buffer is above the upper threshold or below the lower threshold. The FIFO buffer has a desired data level within the target data level range. In one embodiment, the time stamp adjuster adjusts the time stamp component by a percentage that is based at least in part upon an offset equal to the difference between the actual data level in the FIFO buffer and the desired data level. In another embodiment, the status is based at least in part on a change in the actual data level in the FIFO buffer over time In some embodiments, the time stamp adjuster includes a buffer monitor that monitors the actual data level in the FIFO buffer at a predetermined time interval. In one embodiment, the time stamp adjuster adjusts the time stamp component by an amount that is based on a calculation. In another embodiment, the time stamp adjuster adjusts the time stamp component by an amount that is determined from a lookup table or register.

The present invention is also directed toward a method for correcting a frequency of an output clock in a receiving device.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

A system 10 includes an output clock correction circuit 14 (also sometime referred to herein as a "correction circuit" or "circuit") that corrects the frequency of an output clock from a source clock having a similar or different frequency as that of the output clock. The present invention can apply to any cross-clock domain data transport system, such as from a source clock domain to an output clock domain, as described herein. Although the description provided herein focuses primarily on video systems, and in particular, stream clock correction circuits, it is recognized that no limitation to video systems should be construed from the description herein. For example, the correction circuit 14 disclosed and described herein can equally be useful for audio applications in which it is necessary to recover and/or correct a variable audio clock sampling frequency in a receiving device based on a fixed source clock transmitter frequency. Additionally, any other suitable type of cross-clock domain data transport system can benefit from the technology disclosed and described herein.

Figure 1:
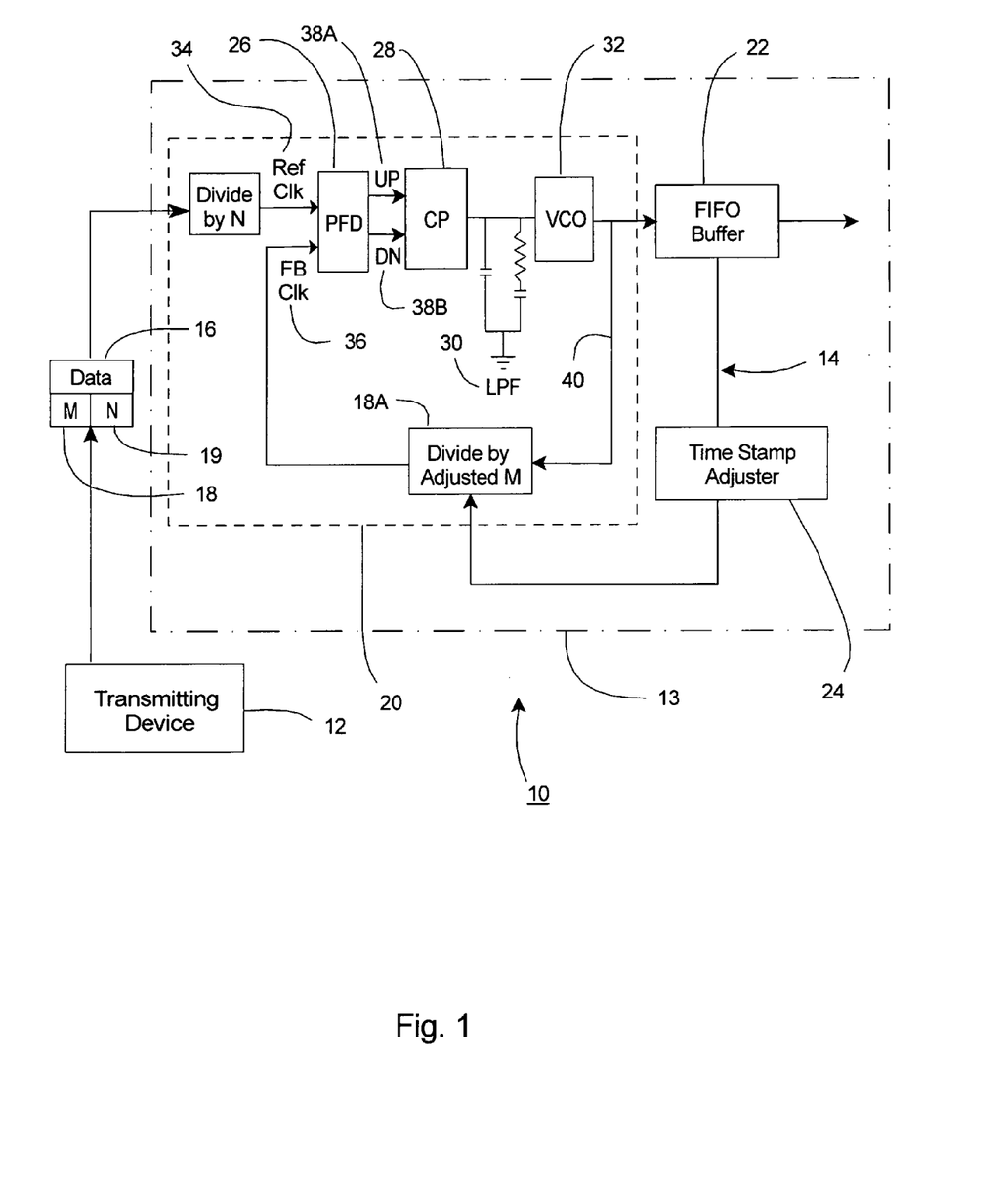
FIG. 1 is a schematic flow diagram illustrating one embodiment of an output clock correction circuit having features of the present invention, including a time stamp adjuster.

FIG. 1 is a flow chart diagram that provides a schematic of one embodiment of a system 10 that includes a transmitting device 12 and a receiving device 13 (illustrated within the dot-dash rectangle). It is understood that an alternative embodiment of the system 10 can include only the receiving device 13 and can omit the transmitting device 12. The receiving device 13 includes one embodiment of the output clock correction circuit 14. It is recognized that the specific architecture of the output clock correction circuit 14 can be varied to suit the design requirements of the system. In the embodiment illustrated in FIG. 1, the source clock is included in a data stream that originates from the transmitting device 12. The source clock is first serialized and is subsequently recovered, i.e. deserialized, through clock and data recovery ("CDR") at the receiving device 13 (illustrated as an outer dashed-line rectangle in FIG. 1). For clarity, deserialization of the source clock is not illustrated in FIG. 1.

The data stream includes input data 16 such as byte data, and time stamp information including a first time stamp component 18 and a second time stamp component 19 (also shown in FIG. 1 as "M" and "N", respectively). In certain embodiments, the time stamp components 18, 19 can be 24-bit data that are based on the relative frequencies of the source clock and the output clock. It is understood that the time stamp components 18, 19 can alternatively include information other than 24-bit data.

In the embodiment illustrated in FIG. 1, the output clock correction circuit 14 includes an output clock feedback loop 20 (illustrated as an inner dashed-line rectangle in FIG. 1), a FIFO buffer 22 and a time stamp adjuster 24. The output clock feedback loop 20 adjusts at least one of a phase of the output clock and a frequency of the output clock. In certain embodiments, the adjustment is based at least partially on one or more of the time stamp components 18, 19. More specifically, in one embodiment, the adjustment is based at least partially on the first time stamp component 18 so that the value of the first time stamp component 18 impacts the extent of adjustment of the phase and/or frequency of the output clock.

In one embodiment, the output clock feedback loop 20 can include one of any number of different types of phase-locked loop ("PLL") circuits known to those skilled in the art. The specific design of the PLL circuit 20 can be varied. For example, in the embodiment illustrated in FIG. 1, the PLL circuit 20 can include one or more of a phase frequency detector 26 ("PFD"), a charge-pump circuit 28 ("CP"), a low-pass filter 30 ("LPF") or other type of filter, and a voltage-controlled oscillator 32 ("VCO"). It is recognized that one or more of these structures can be omitted entirely from the output clock feedback loop 20. Alternatively, the output clock feedback loop 20 can include additional or alternative somewhat similar structures without departing from the spirit or scope of the present invention. The output clock feedback loop 20 can be more complex or less complex than the output clock feedback loop 20 illustrated in FIG. 1.

In one embodiment, the source clock is divided by an integer such as the second time stamp component 19 (N) to generate a reference clock 34 (illustrated as "Ref Clk" in FIG. 1). The reference clock 34 and a feedback clock signal 36 (illustrated as "FB Clk" in FIG. 1) are then compared using the PFD 26.

The PFD 26 can have two outputs 38A, 38B (UP or DN, respectively) which instruct subsequent circuitry on how to adjust (upwards or downwards) to lock onto the required phase. The outputs 38A, 38B are fed to the CP 28, which can be an analog current switch that generates either a higher or a lower voltage signal to one or more capacitors of the LPF 30. The LPF 30 integrates the voltage signal to smooth it. This smoothed signal is then fed to the VCO 32. Output data 40 from the VCO 32 is transmitted to the FIFO buffer 22, and is also indirectly and cyclically fed back to the PFD 26 for comparison with the reference clock 34. The first time stamp component 18 (M) is incorporated into this feedback cycle as a divisor. As explained in greater detail below, the time stamp adjuster 24 includes a buffer monitor (not shown) that monitors a status of the FIFO buffer 22. Based on the status of the FIFO buffer 22, the time stamp adjuster 24 selectively adjusts the first time stamp component 18 upwards or downwards to generate an adjusted first time stamp component 18A. With this design, the system 10 can more accurately recover the output clock, and/or can improve the jitter performance of the system 10.

Figure 2:
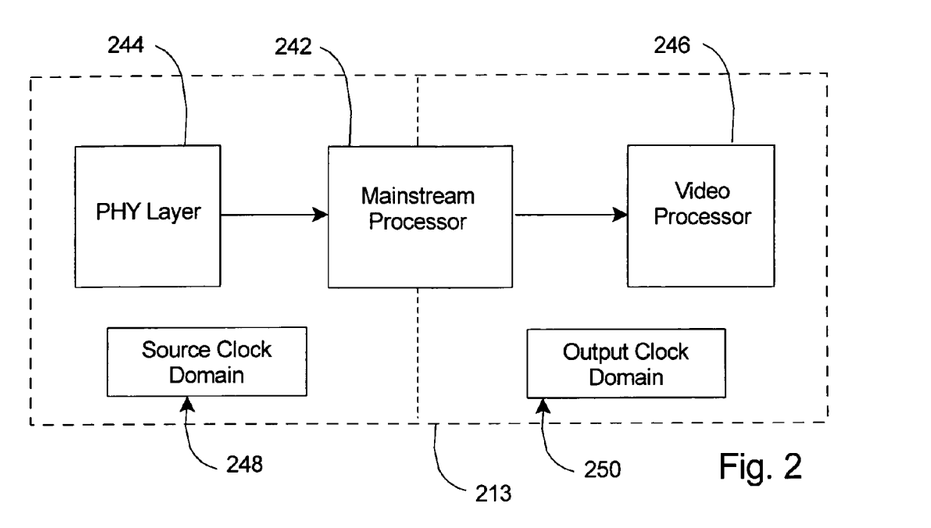
FIG. 2 is a block diagram illustrating an overview of a receiving device including a mainstream processor.

FIG. 2 is a block diagram illustrating an overview of a receiving device 213 including a mainstream processor 242. In this embodiment, the mainstream processor sits between a physical layer 244 and a video processor 246. The source clock can include a link symbol clock in a source clock domain 248, as illustrated in FIG. 2. In certain embodiments, input data 16 (illustrated in FIG. 1) can include decoded data bytes and/or K-code special symbols. Further, the output data 40 (illustrated in FIG. 1) can include pixel data in an output clock domain 250, along with recovered display timing information, such as data enable (DE), H-sync, V-sync, etc., as is known in the art.

Figure 3:
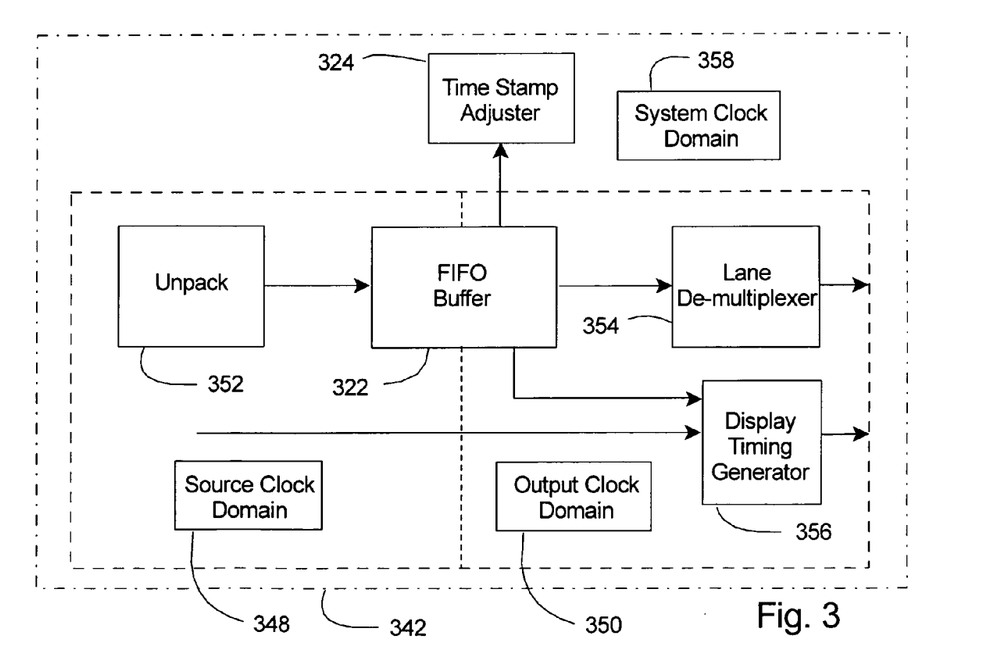
FIG. 3 is a block diagram of one embodiment of the time stamp adjuster and the mainstream processor including a FIFO buffer.

FIG. 3 is a block diagram of a portion (illustrated within the dot-dash line) of the system 310 including one embodiment of the mainstream processor 342 (illustrated within dashed line). In the embodiment illustrated in FIG. 3, the mainstream processor 342 includes a unpack block 352, a lane demultiplexer 354, the FIFO buffer 322, a display timing generator 356, and the time stamp adjuster 324. In one embodiment, the unpack block 352 and a portion of the FIFO buffer 322 are within the source clock domain 348. Additionally, the remainder of the FIFO buffer 322, the lane demultiplexer 354 and the display timing generator 356 are within the output clock domain 350. Further, the time stamp adjuster 324 can be within a system clock domain 358 as illustrated in FIG. 3. However, it is recognized that the various components of the mainstream processor 342 can alternatively be included within different domains than those illustrated in the embodiment in FIG. 3.

The design of the unpack block 352 can vary. In one embodiment, the unpack block 352 can take source (bytes) data 16 (illustrated in FIG. 1) from the physical layer 244 (illustrated in FIG. 2), and can extract output (pixel) data 40 (illustrated in FIG. 1). In certain embodiments, a circular buffer can be used to extract the pixel data from the byte data. Alternatively, a different type of buffer can be utilized.

In one embodiment, the lane demultiplexer 354 combines data from multiple lanes and forms one single pixel data stream.

The FIFO buffer 322 includes a memory that temporarily stores output data 40. The design of the FIFO buffer 322 can vary. In one embodiment, the FIFO buffer is asynchronous. In certain embodiments, the FIFO buffer 322 is positioned where the clock crossing occurs as illustrated in FIG. 3. For example, the source clock can be the write-side clock, and the output clock can be the read-side clock. In one embodiment, the FIFO buffer 322 can be 122 bits wide and 64 bits deep. In this embodiment, the maximum pixels that can be buffered is 64 pixels for one lane, 128 pixels for two lanes, and 256 for four lanes. The FIFO buffer width of 122 bits accommodates buffering 4 pixels in the 4-lane mode, 2 extra bits for tag information of the first pixel of each line and the first line of each frame. The depth of 64 bits is chosen in this embodiment based on one or more of (i) the variation within one transfer unit, (ii) the FIFO buffer being needed for accommodating output clock variation, and (iii) the output clock PLL offset performance is uncertain.

In certain embodiments, based on frame parameters from an attribute packet and the availability from the FIFO buffer 322, the display timing generator 356 generates display timing information such as data enable (DE), H-sync, V-sync, etc.

As explained in greater detail below, based on a status of the FIFO buffer 322 at some predetermined interval, such as the first pixel $P_1$ of each line $L_1$-$L_n$, as one non-exclusive example, the time stamp adjuster 324 selectively adjusts the first time stamp component 18 based on a algorithm or based on a lookup table or register.

Figure 4:
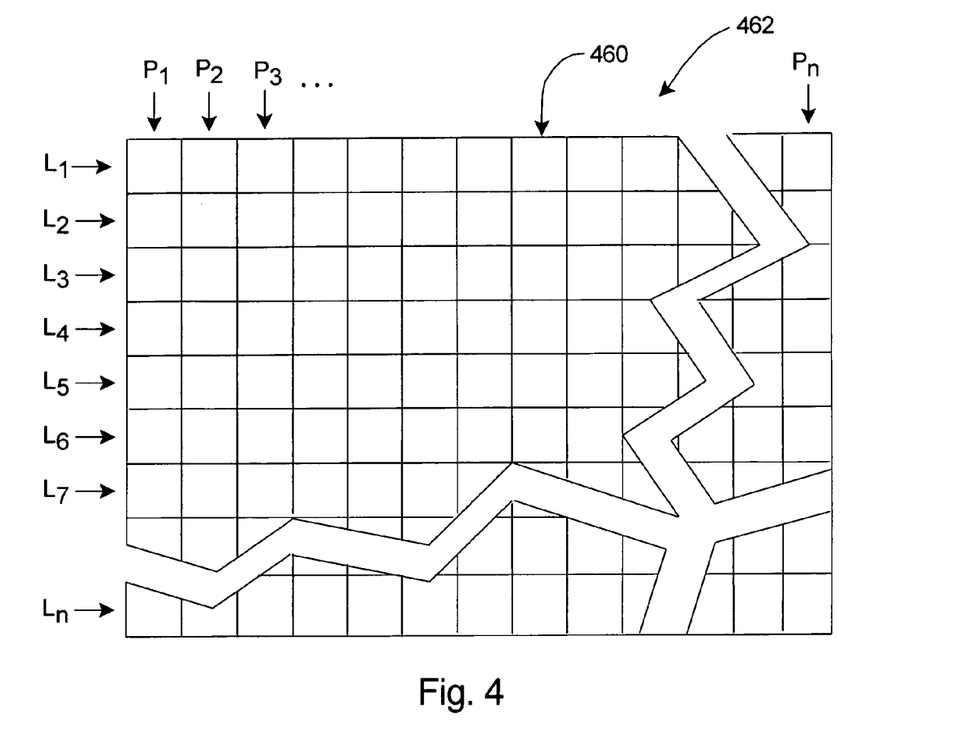
FIG. 4 is a simplified partial view of one frame of a receiving device including a plurality of lines and a plurality of pixel clocks.

FIG. 4 is a simplified partial view of one frame 460 of a receiving device 462 including a plurality of lines $L_1$-$L_n$ and a plurality of pixel clocks $P_1$-$P_n$.

Various synchronization modes are supported for timing recovery. The following provide non-exclusive examples of some synchronization modes that can each be used exclusively. Alternatively, one of the synchronization modes can be combined with one or more of the other synchronization modes.

In one embodiment, the timing recovery can run in a line sync mode. In the line sync mode, the display timing counters can be reset at the availability of the first pixel $P_1$, and there are a certain number of pixels that are buffered in each line $L_1$-$L_n$. During a vertical blanking period, the display timing counters can be running in free-run mode (described below) since there is no synchronization information sent by the transmitting device 12 (illustrated in FIG. 1) during this period of time.

In another embodiment, the timing recovery can run in a frame sync mode. In the frame sync mode, each frame 460 will be synchronized only once, which can occur at the first pixel $P_1$ of the first line $L_1$ of each frame 460. After this point, frame recovery will be in free-run mode until the next frame data comes in.

In still another embodiment, the timing recovery can run in a free-run mode. In the free-run mode, frame sync is performed at least once, then the display timing counters enter into free-run mode. This mode is facilitated by either auto-switching or forced switching (by firmware) between frame sync and free-run modes.

In yet another embodiment, the timing recovery can run in a stand alone mode. In the stand alone mode, the receiving device 462 will display pattern generator data and video PLL could be in an open loop mode.

If the FIFO buffer is close to empty or full at the first pixel $P_1$ of each frame 460, frame sync mode will be asserted again. In the free-run mode, at the first pixel $P_1$ of each line $L_1$-$L_n$, the FIFO buffer status is monitored or otherwise checked to determine if the current output clock is slightly faster or slightly slower which could put the FIFO buffer at risk of underflow or overflow. At the end of each line $L_1$-$L_n$, the first time stamp component M can be adjusted, if necessary, according to a lookup table or by calculation.

Figure 5:
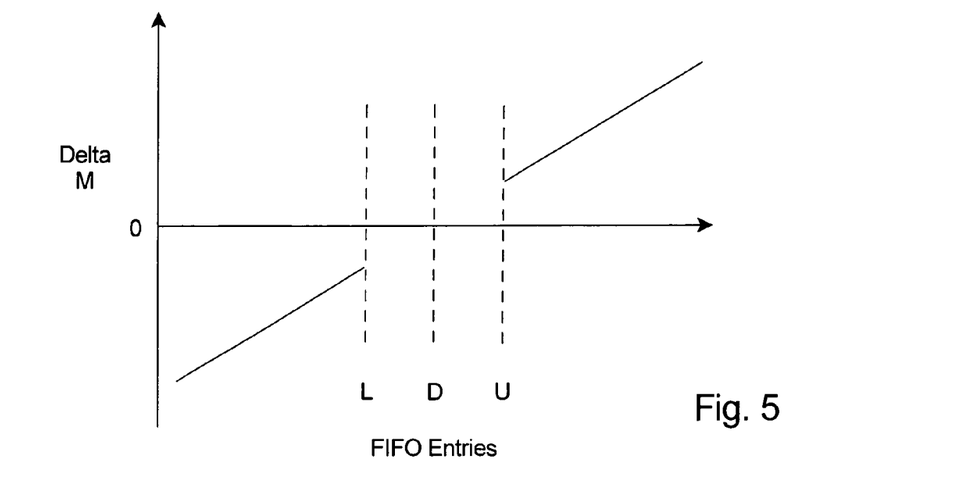
FIG. 5 is a graph illustrating a change in a first time stamp component M by the time stamp adjuster as a function of the number of FIFO entries in the FIFO buffer.

FIG. 5 is a graph illustrating one embodiment of a change in the first time stamp component (Delta M) by the time stamp adjuster as a function of the number of FIFO entries in the FIFO buffer. In one embodiment, the FIFO buffer has a target data level range that includes an upper threshold (indicated as "U" in FIG. 5), a lower threshold (indicated as "L" in FIG. 5), and a desired data level (indicated as "D" in FIG. 5). In one embodiment, the desired data level is approximately one-half of the FIFO depth. In an alternative embodiment, the desired data level can be greater than or less than one-half of the FIFO depth. In the embodiment illustrated in FIG. 5, when the number of FIFO entries corresponding to the data level is between U and D, inclusive, no adjustment to the first time stamp component M is made. In the target data level range, it is assumed that FIFO is running in a normal state and the immediate danger of overflow or underflow is reduced.

However, when the number of FIFO entries corresponding to the data level is above U, a positive adjustment to the first time stamp component M is made. Referring back to FIG. 1, by increasing the value of M that is used as a divisor during PLL, the frequency of the output clock is decreased. By decreasing the output clock frequency, data does not enter and accumulate in the FIFO buffer as rapidly. As a result, the data level in the FIFO buffer will decrease. If the appropriate value for Delta M is used, the data level in the FIFO buffer can be controlled to remain within the target data level range.

Conversely, when the number of FIFO entries corresponding to the data level is below L, a negative adjustment to the first time stamp component M is made. By decreasing the value of M that is used as a divisor during PLL, the frequency of the output clock is increased. By increasing the output clock frequency, data enters and accumulates in the FIFO buffer more rapidly. As a result, the data level in the FIFO buffer will increase, and as indicated above, can remain within the target data level range.

In an alternative embodiment, the status buffer monitor monitors the status of the FIFO buffer somewhat differently than previously described. In this embodiment, the status of the FIFO buffer that is monitored is based at least in part on a change in the actual data level in the FIFO buffer over time. In one such embodiment, the buffer monitor monitors the rate of change over time to determine whether the time stamp adjuster needs to adjust the first time stamp component M. Thus, even though the actual data level may be within the target data level range, the rate and/or direction of change of the actual data level may be rapid enough to dictate that the time stamp adjuster needs to adjust the first time stamp component M. Conversely, even though the actual data level may be outside the target data level range, the rate and/or direction of change of the actual data level may be such that the time stamp adjuster does not need to adjust the first time stamp component M. Stated another way, in one embodiment, the time stamp adjuster can predict whether the actual data level will be within the target data level range at a future time based on the actual data level and the rate and/or direction of change of the actual data level.

Figure 6:
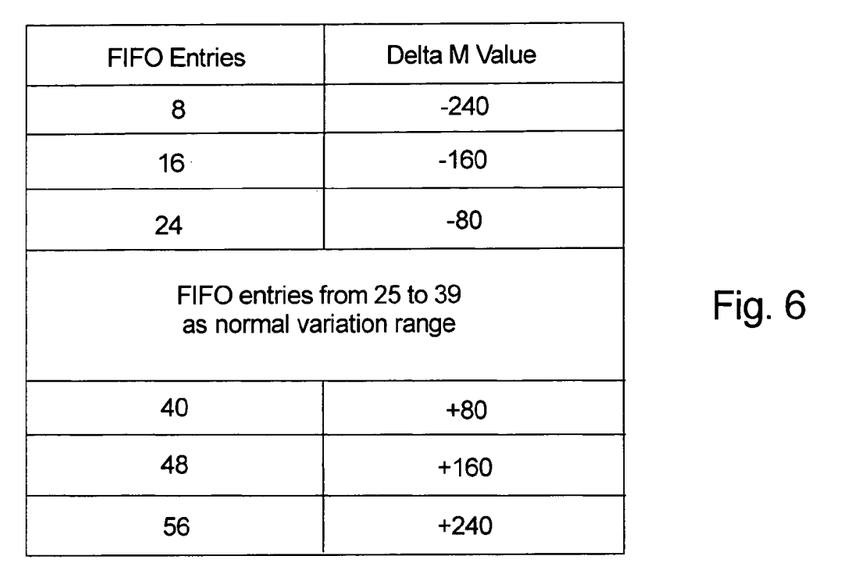
FIG. 6 is one embodiment of a lookup table that can be used by the time stamp adjuster to determine a change in the first time stamp component M.

FIG. 6 is one non-exclusive example of a lookup table that can be used by the time stamp adjuster to determine a change in the first time stamp component M. It is recognized that the actual lookup table that can be used can be varied depending upon the size of the FIFO buffer, the number of pixels per line of the receiving device, and/or the requirement for certain tolerance levels, as non-exclusive examples. In other words, the lookup table illustrated in FIG. 6 is provided for ease of explanation only, and no limitations are intended or implied. For example, a narrower or wider target data level range may be required for a certain application. In the example illustrated in FIG. 6, the target data level range is between 24 and 40 FIFO entries. In this embodiment, provided that the number of FIFO entries is between 24 and 40, no adjustment is made to the first time stamp component M. However, if the number of FIFO entries is between 16 and 24, inclusive, in this example, Delta M equals −80, and M is therefore decreased by 80. If the number of FIFO entries is between 48 and 56, inclusive, in this example, Delta M equals +160, and M is therefore increased by 160, and so on.

It is understood that the lookup table can be more or less precise than that illustrated in FIG. 6, as required to suit the design requirements of the system 10. Stated another way, consecutive Delta M values can be more or less graduated, the number of FIFO entries required for a change in Delta M values can be more or less closely spaced, etc.

In the embodiment of the lookup table illustrated in FIG. 6, the target data level range can be preset so that the range reflects a specific percentage of the depth of the FIFO buffer. For example, the target data level range in this embodiment is 16, which is 25% of the total depth of 64. In non-exclusive alternative embodiments, the target data level range can be less than approximately 75%, 50%, 40%, 30%, 20%, 10% or 5% of the total depth of the FIFO buffer. In still another embodiment, the target data level range can be equal to the desired data level. Stated another way, the target data level range can be zero such that any deviation from the desired data level results in the time stamp adjuster adjusting the first time stamp component M.

In yet another alternative embodiment, an algorithm is applied to calculate the appropriate Delta M at various points in time, i.e. predetermined intervals or some other time frame scheme. In one such embodiment, the algorithm can be used to calculate Delta M, as follows:

$$\frac{(FIFO \text{ offset}) \times M}{H_{Total}} \quad [1]$$

In Equation [1], the FIFO offset is difference between the desired data level and the actual data level in the FIFO buffer at a particular point in time, i.e. at the first pixel $P_1$ of each line $L_1$-$L_n$ of the frame. Further, $H_{Total}$ is the number of pixels in each horizontal line of the receiving device. In this embodiment, upper and lower thresholds can be predetermined for Delta M based on this algorithm to determine if and when the first time stamp component will be adjusted. In other words, if the absolute value of Delta M is less than a certain value, no adjustment is made to the first time stamp component M. Conversely, if the absolute value of Delta M is greater than a certain value, an adjustment is made to the first time stamp component M.

The adjustment to the first time stamp component M can be in the form of a multiplier that is based on a percentage that is calculated from an algorithm. For example, if the FIFO offset at a particular time is +32, and the $H_{Total}$ is 2000, the frequency at which data enters the FIFO buffer needs to be decreased by 32/2000=0.016 or 1.6%. Therefore, the first time stamp component M should be increased by 1.6% so that the divisor (adjusted M) used during the output clock feedback loop (e.g., PLL) is greater, which effectively slows the frequency at which data enters the FIFO buffer. As a consequence, less accumulation of pixel data in the FIFO buffer occurs, which decreases the likelihood of overflow.

It is recognized that the algorithm provided above is just one example of many possible algorithms, and that no limitations are intended or implied, provided that any adjustment made to the first time stamp component M is based on the status of the FIFO buffer.

Figure 7:
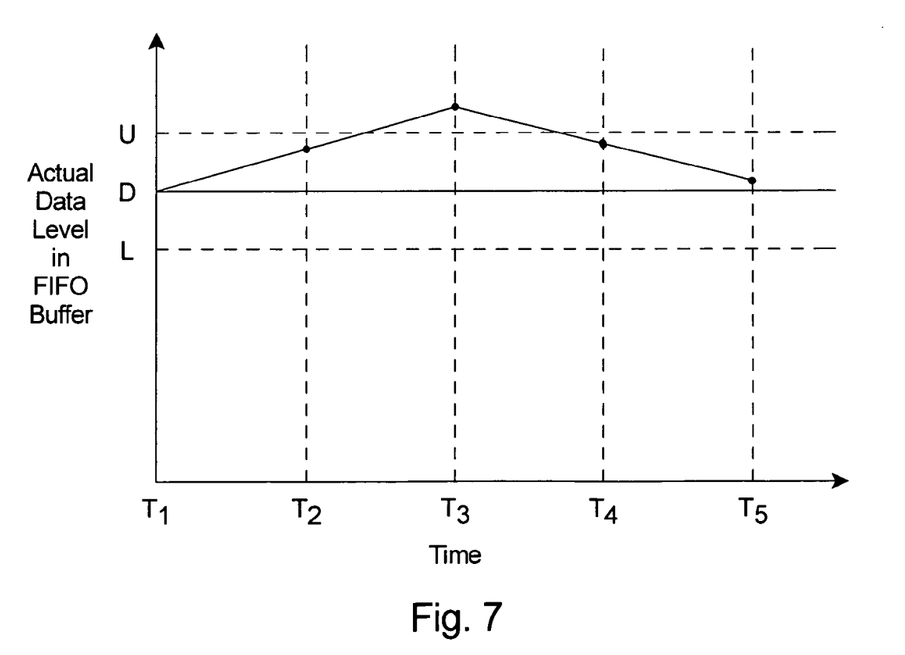
FIG. 7 is a graph illustrating an actual data level in the FIFO buffer as a function of time as a result of use of the output clock correction circuit having features of the present invention.

FIG. 7 is an exemplar graph illustrating an actual data level in the FIFO buffer as a function of time as a result of use of the output clock correction circuit. In this example, at $T_1$, the actual data level (FIFO entries) in the FIFO buffer is at the desired level, which is within the target data level range. Therefore, at $T_1$, no adjustment to the first time stamp component M is made.

At $T_2$, the actual data level has increased somewhat from the actual data level at $T_1$, but it is still within the target data level range. Thus, at $T_2$, no adjustment to the first time stamp component M is made.

At $T_3$, the actual data level has increased above the upper threshold U of the target data level range. Therefore, at $T_3$, the time stamp adjuster determines that an adjustment to the first time stamp component M is necessary. Either by utilizing a lookup table or by calculation as described previously herein, the first time stamp component M is adjusted for use during the output clock feedback loop to adjust the actual data level in the FIFO buffer so that it is within the target data level range.

At $T_4$, the actual data level has decreased somewhat from the actual data level at $T_3$, and it has moved to within the target data level range. Thus, at $T_4$, no adjustment to the first time stamp component M is made.

At $T_5$, the actual data level has decreased somewhat from the actual data level at $T_4$, but it is still within the target data level range. Thus, at $T_5$, no adjustment to the first time stamp component M is made.

The times $T_1$-$T_5$ illustrated in FIG. 7 can be representative of various time frames. In one embodiment, each of the times $T_1$-$T_5$ can represent the first pixel $P_1$ of each line of the frame. In another embodiment, each of the times $T_1$-$T_5$ can represent the first pixel $P_1$ of every other line of the frame. In still another embodiment, each of the times $T_1$-$T_5$ can represent the first pixel $P_1$ of every frame. In yet another embodiment, each of the times $T_1$-$T_5$ can represent an actual predetermined duration of time. It is understood that these examples for what is represented by the times $T_1$-$T_5$ are provided for ease of discussion, and that many other possibilities for $T_1$-$T_5$ exist, including both uniform intervals and non-uniform intervals of time.

Figure 8:
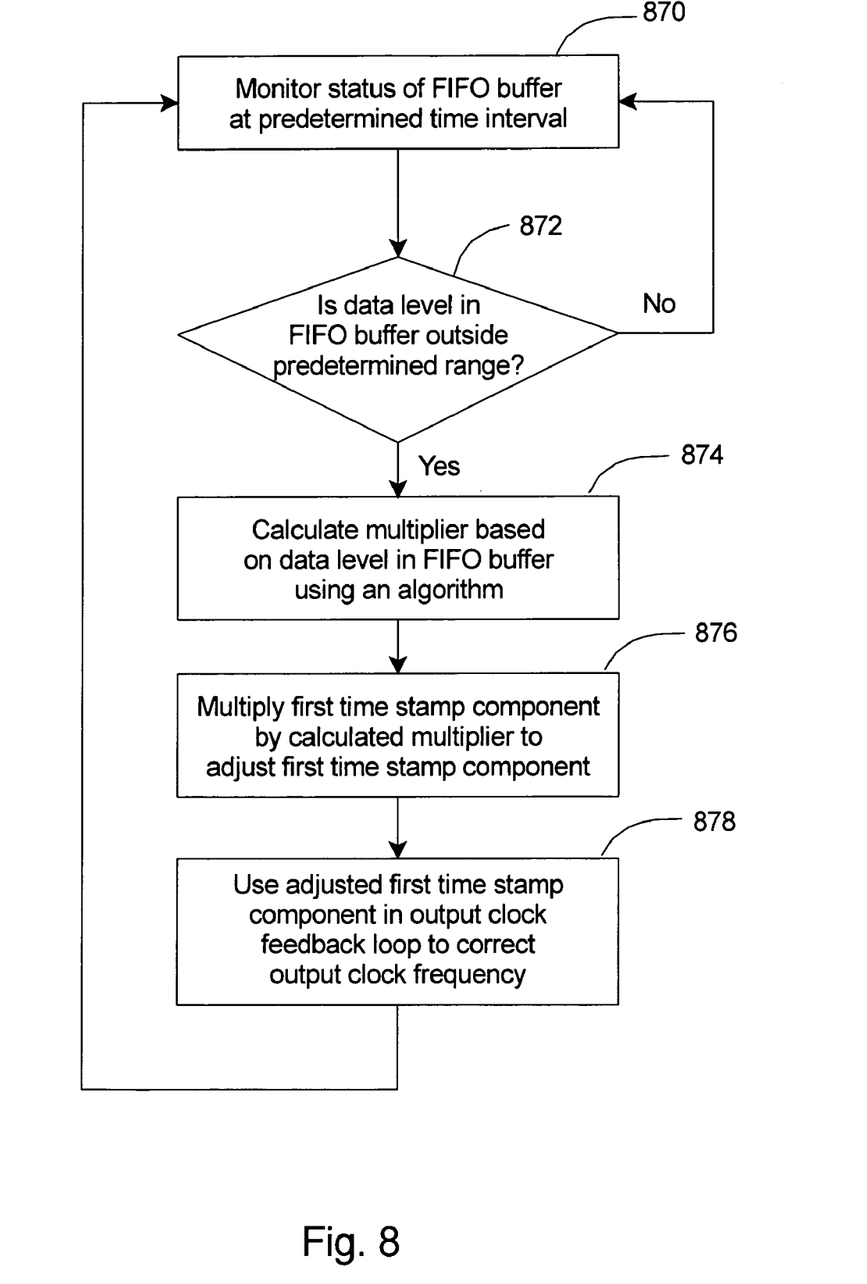
FIG. 8 is a flow chart illustrating one embodiment of a method for correcting an output clock frequency in a receiving device.

FIG. 8 is a flow chart illustrating one embodiment of a method for correcting an output clock frequency in a receiving device. In this embodiment, at step 870, the time stamp adjuster monitors a status of the FIFO buffer at a predetermined time interval, as described previously herein. The time interval can be based at least partially on time, or it can be based at least partially on an event, such as at the first pixel clock of each line of a given frame, as one non-exclusive example.

At step 872, the time stamp adjuster determines whether the actual data level in the FIFO buffer falls outside of a predetermined target data level range. If it is determined that the actual data level does not fall outside of this range, e.g., it falls within the target data level range, then the time stamp adjuster waits until the next predetermined time interval and repeats step 870. If it is determined that the actual data level falls outside of the target data level range, then the time stamp adjuster calculates a multiplier at step 874 using an algorithm, as described previously herein. In certain embodiments, the algorithm can be at least partially based on the actual data level in the FIFO buffer compared with another data level. In one embodiment, the data level to which the actual data level is compared can be the desired data level. Alternatively, the data level to which the actual data level is compared can be one of the upper or the lower threshold level.

At step 876, the first time stamp component is multiplied by the calculated multiplier to adjust the first time stamp component upwards or downwards.

At step 878, the adjusted first time stamp component is utilized in the output clock feedback loop, such as PLL, to correct the output clock frequency. With this method, the incidence of overflow or underflow in the FIFO buffer can be reduced. This process is repeated at the appropriate time interval at step 870.

Figure 9:
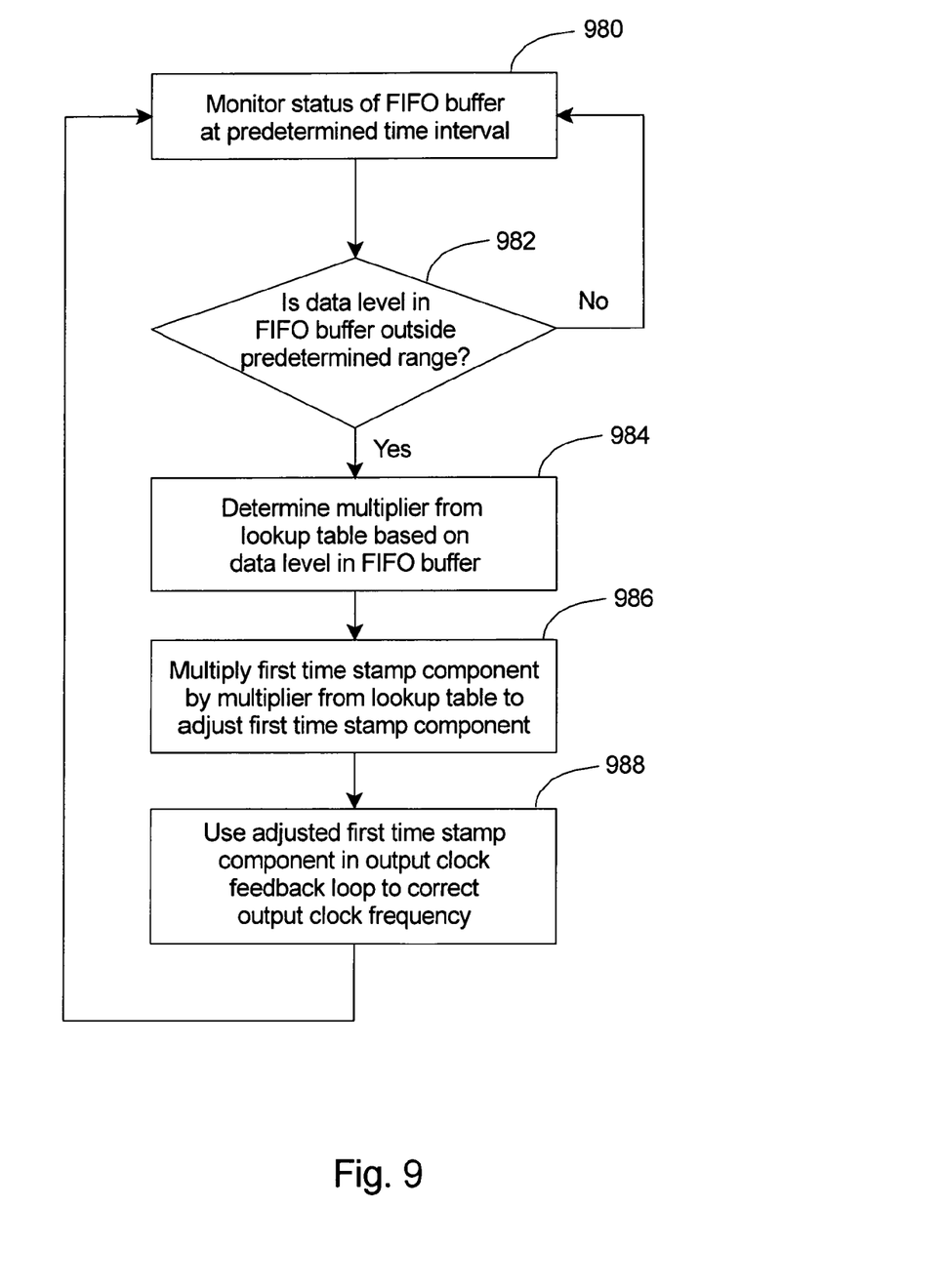
FIG. 9 is a flow chart illustrating another embodiment of a method for correcting the output clock frequency in the receiving device.

FIG. 9 is a flow chart illustrating another embodiment of a method for correcting the output clock frequency in the receiving device. In this embodiment, at step 980, the time stamp adjuster monitors a status of the FIFO buffer at a predetermined time interval, as described previously herein. The time interval can be based at least partially on time, or it can be based at least partially on an event, such as at the first pixel clock of each line of a given frame, as one non-exclusive example.

At step 982, the time stamp adjuster determines whether the actual data level in the FIFO buffer falls outside of a predetermined target data level range. If it is determined that the actual data level does not fall outside of this range, e.g., it falls within the target data level range, then the time stamp adjuster waits until the next predetermined time interval and repeats step 980. If it is determined that the actual data level falls outside of the target data level range, then the time stamp adjuster determines a multiplier at step 984 from a lookup table or register, as described previously herein.

At step 986, the first time stamp component is multiplied by the multiplier from the lookup table or register to adjust the first time stamp component upwards or downwards.

At step 988, the adjusted first time stamp component is utilized in the output clock feedback loop, such as PLL, to correct the output clock frequency. With this method, the incidence of overflow or underflow in the FIFO buffer can be reduced. This process is repeated at the appropriate time interval at step 980.

While the particular system 10 and output clock correction circuit 15 as herein shown and disclosed in detail are fully capable of obtaining the objects and providing the advantages herein before stated, it is to be understood that they are merely illustrative of one or more embodiments and that no limitations are intended to the details of construction or design herein shown other than as described in the appended claims.

What is claimed is:

1. A circuit for correcting a frequency of an output clock in a receiving device, the receiving device receiving data and a time stamp component, the time stamp component being based at least partially on a desired frequency of the output clock, the circuit comprising:
    an output clock feedback loop that adjusts at least one of a phase of the output clock and a frequency of the output clock, the adjustment being based at least partially on the time stamp component;
    a FIFO buffer that temporarily stores the data, the FIFO buffer having an actual data level, a target data level ranqe including an upper threshold and a lower threshold, and a desired data level within the target data level range; and
    a time stamp adjuster that selectively adjusts the time stamp component based on a status of the FIFO buffer, the status of the FIFO buffer being based at least in part on the actual data level;
    wherein when the actual data level in the FIFO buffer is above the upper threshold, the time stamp adjuster increases the time stamp component by a percentage that is based at least in part upon an offset equal to the difference between the actual data level in the FIFO buffer and the desired data level.

2. The circuit of claim 1 wherein the output clock feedback loop is a phase-locked loop.

3. The circuit of claim 1 wherein the time stamp adjuster includes a buffer monitor that periodically monitors the status of the FIFO buffer at a predetermined time interval, and wherein the percentage is further based at least in part upon the length of the predetermined time interval.

4. The circuit of claim 1 wherein the time stamp adjuster adjusts the time stamp component when the actual data level of the FIFO buffer is below the lower threshold.

5. The circuit of claim 4 wherein when the actual data level of the FIFO buffer is below the lower threshold, the time stamp adjuster decreases the time stamp component by a percentage that is based at least in part upon an offset between the actual data level and the desired data level.

6. The circuit of claim 1 wherein the time stamp adjuster does not adjust the time stamp component when the actual data level of the FIFO buffer is between the upper threshold and the lower threshold.

7. The circuit of claim 1 wherein the status of the FIFO buffer is based at least in part on a change in the actual data level in the FIFO buffer over time.

8. The circuit of claim 3 wherein the receiving device includes a video output having a line that includes a plurality of pixels, and wherein the predetermined time interval is based at least in part on the number of pixels per line and the output clock frequency.

9. The circuit of claim 3 wherein the receiving device includes a video output having a plurality of lines, each line having a plurality of pixels, and wherein the predetermined time interval is based on the number of lines of the video output.

10. The circuit of claim 1 wherein the time stamp adjuster adjusts the time stamp component by an amount that is based on a calculation.

11. The circuit of claim 1 wherein the time stamp adjuster adjusts the time stamp component by an amount that is determined from a lookup table.

12. The circuit of claim 1 wherein the FIFO buffer is a line buffer.

13. A receiving device including the circuit of claim 1.

14. A method for correcting a frequency of an output clock in a receiving device, the method comprising the steps of:
    adjusting at least one of a phase of the output clock and a frequency of the output clock with an output clock feedback loop, the adjustment being based at least partially on a time stamp component that is received by the receiving device;
    temporarily storing data received by the receiving device in a FIFO buffer having a status that is based at least in part on an actual data level; and
    selectively adjusting the time stamp component based on the status of the FIFO buffer with a time stamp adjuster when the actual data level of the FIFO buffer falls outside of a target data level range including an upper threshold and a lower threshold, the adjustment being by a percentage that is based at least in part upon an offset equal to the difference between the actual data level and a desired data level in the FIFO buffer.

15. The method of claim 14 wherein the output clock feedback loop is a phase-locked loop.

16. The method of claim 14 wherein the step of selectively adjusting includes not adjusting the time stamp component when the actual data level of the FIFO buffer falls within the target data level range.

17. The method of claim 14 wherein the step of temporarily storing data includes the status being based at least in part on a change in the actual data level in the FIFO buffer over time.

18. The method of claim 14 wherein the step of selectively adjusting includes monitoring the status of the FIFO buffer at a predetermined time interval with a buffer monitor.

19. The method of claim 14 wherein the step of selectively adjusting includes adjusting the time stamp component by an amount that is based on an algorithm.

20. The method of claim 14 wherein the step of selectively adjusting includes adjusting the time stamp component by an amount that is determined from a lookup table.

21. The method of claim 14 wherein the step of temporarily storing includes the FIFO buffer being a line buffer.

22. A circuit for correcting a frequency of an output clock in a receiving device, the receiving device receiving data and a time stamp component, the time stamp component being based at least partially on a desired frequency of the output clock, the circuit comprising:
    an output clock feedback loop that adjusts at least one of a phase of the output clock and a frequency of the output clock, the adjustment being based at least partially on the time stamp component;
    a FIFO buffer that temporarily stores the data, the FIFO buffer having an actual data level, a target data level range having a lower threshold, and a desired data level within the target data level range; and
    a time stamp adjuster that selectively adjusts the time stamp component based on a status of the FIFO buffer, the status of the FIFO buffer being based at least in part on the actual data level;
    wherein when the actual data level of the FIFO buffer is below the lower threshold, the time stamp adjuster decreases the time stamp component by a percentage that is based at least in part upon an offset between the actual data level and the desired data level.

23. The circuit of claim 22 wherein the output clock feedback loop is a phase-locked loop.

24. The circuit of claim 22 wherein the time stamp adjuster includes a buffer monitor that periodically monitors the status of the FIFO buffer at a predetermined time interval, and wherein the percentage is further based at least in part upon the length of the predetermined time interval.

25. The circuit of claim 24 wherein the receiving device includes a video output having a line that includes a plurality of pixels, and wherein the predetermined time interval is based at least in part on the number of pixels per line and the output clock frequency.

26. The circuit of claim 24 wherein the receiving device includes a video output having a plurality of lines, each line having a plurality of pixels, and wherein the predetermined time interval is based on the number of lines of the video output.

27. The circuit of claim 22 wherein the status is based at least in part on a change in the actual data level in the FIFO buffer over time.

28. The circuit of claim 22 wherein the time stamp adjuster adjusts the time stamp component by an amount that is based on a calculation.

29. The circuit of claim 22 wherein the time stamp adjuster adjusts the time stamp component by an amount that is determined from a lookup table.

30. The circuit of claim 22 wherein the FIFO buffer is a line buffer.

31. A receiving device including the circuit of claim 22.

* * * * *